(12) United States Patent
Iwashita et al.

(10) Patent No.: US 7,163,874 B2
(45) Date of Patent: Jan. 16, 2007

(54) FERROELECTRIC THIN FILM MANUFACTURING METHOD, FERROELECTRIC ELEMENT MANUFACTURING METHOD, SURFACE ACOUSTIC WAVE ELEMENT, FREQUENCY FILTER, OSCILLATOR, ELECTRONIC CIRCUIT, AND ELECTRONIC APPARATUS

(75) Inventors: Setsuya Iwashita, Nirasaki (JP);
Takamitsu Higuchi, Matsumoto (JP);
Hiromu Miyazawa, Toyoshina-machi (JP)

(73) Assignee: Seiko Epson Corporation (JP)

( * ) Notice: Subject to any disclaimer, the term of this patent is extended or adjusted under 35 U.S.C. 154(b) by 313 days.

(21) Appl. No.: 10/803,479

(22) Filed: Mar. 18, 2004

(65) Prior Publication Data

US 2004/0238866 A1 Dec. 2, 2004

(30) Foreign Application Priority Data

Mar. 26, 2003 (JP) .............................. 2003-085760

(51) Int. Cl.
 *H01L 21/30* (2006.01)
(52) U.S. Cl. ..................... 438/458; 438/3; 438/E21.6; 438/464; 438/E21.601; 438/745
(58) Field of Classification Search ..................... 438/3, 438/8, 50, 458, 464, 716, 745, 118, 240
See application file for complete search history.

(56) References Cited

U.S. PATENT DOCUMENTS 5,527,766 A * 6/1996 Eddy ........................... 505/410
6,677,629 B1 * 1/2004 Fischer et al. .............. 257/295

FOREIGN PATENT DOCUMENTS

| JP | 2001-107238 | 4/2001 |
|---|---|---|
| JP | 2001-196892 | 7/2001 |
| JP | 2002-076294 | 3/2002 |
| JP | 2003-017981 | 1/2003 |

* cited by examiner

*Primary Examiner*—Quoc Hoang
(74) *Attorney, Agent, or Firm*—Harness, Dickey & Pierce, P.L.C.

(57) ABSTRACT

A ferroelectric element manufacturing method includes the steps of forming a buffer layer, which also functions as a sacrificial layer, on a single crystal substrate, forming a ferroelectric film on the buffer layer, separating the ferroelectric film and the single crystal substrate, and arranging the ferroelectric film that was separated from the single crystal substrate on an optional substrate.

1 Claim, 9 Drawing Sheets

FERROELECTRIC THIN FILM MANUFACTURING METHOD, FERROELECTRIC ELEMENT MANUFACTURING METHOD, SURFACE ACOUSTIC WAVE ELEMENT, FREQUENCY FILTER, OSCILLATOR, ELECTRONIC CIRCUIT, AND ELECTRONIC APPARATUS

BACKGROUND OF THE INVENTION

1. Field of the Invention

This invention relates to a manufacturing method for a ferroelectric thin film, a manufacturing method for a ferroelectric element, a surface acoustic wave element, a frequency filter, an oscillator, an electronic circuit, and an electronic apparatus.

Priority is claimed on Japanese Patent Application No. 2003-85760, filed Mar. 26, 2003, the content of which is incorporated herein by reference.

2. Description of Related Art

Ferroelectric elements having a ferroelectric thin film are used in various types of devices, such as ferroelectric memories, thin film capacitors, sensors, surface acoustic wave elements, filters, optical waveguides, optical memory devices, space light modulators, piezoelectric actuators, and the like. The capabilities of these types of devices vary according to the quality of the ferroelectric thin film in the ferroelectric element in particular. For this reason, the ferroelectric thin film should ideally be an epitaxial film.

Recently there are demands for integrating ferroelectric elements and semiconductor elements in devices such as ferroelectric memories, for instance. Since ferroelectric materials have piezoelectric characteristics, the ferroelectric film becomes a piezoelectric film, and the ferroelectric element functions as a piezoelectric element.

For example, as disclosed in Japanese Unexamined Patent Application, First Publication Nos. 2001-107238 and 2002-76294, when attempting to obtain alignment film or epitaxial film for a ferroelectric thin film, it is necessary to use a special single crystal substrate including an Si substrate.

In view of the cost and wide range of applications of ferroelectric elements, it is desirable to use a substrate that is less expensive than the single crystal substrate (e.g. an amorphous or plastic substrate) for forming the ferroelectric thin film. In this case, however, there is a problem in that the ferroelectric thin film is inadequate in quality, for such reason as it is not possible to grow epitaxially or the like, with the result that the characteristics of the ferroelectric element obtained from it are also inadequate.

When integrating a ferroelectric element with a semiconductor element, the ferroelectric element must be formed on the interlayer insulating film and the protective film, but since these are generally amorphous, it is difficult to grow ferroelectric thin film epitaxially on them. The element must be heated to a temperature of higher than 600° C. in order to form the ferroelectric thin film; however, when attempting to form this ferroelectric thin film on the semiconductor element, there is a danger of damage to the semiconductor element, such as deterioration in its characteristics due to the heat. Moreover, the constituent elements of the ferroelectric thin film include alkali metal, alkaline earth metals, and volatile elements, which semiconductor elements do not like; this considerably restricts the manufacturing process, since the ferroelectric thin film cannot be heated to high temperature.

This invention has been realized in consideration of the problems described above, and aims to provide methods for manufacturing a ferroelectric film and a ferroelectric element, which make it possible to form a high-performance ferroelectric element on any substrates, thereby facilitating the integration of the ferroelectric element with a semiconductor element, a surface acoustic wave element that uses the ferroelectric film and the ferroelectric element, manufactured according to these manufacturing methods, a frequency filter, an oscillator, an electronic circuit, and an electronic apparatus, each of which uses the surface acoustic wave element.

SUMMARY OF THE INVENTION

A first aspect of this invention provides a method for manufacturing a ferroelectric film. The ferroelectric film manufacturing method has the steps of forming a buffer layer, which also functions as a sacrificial layer, on a single crystal substrate, forming a ferroelectric film on the buffer layer, separating the ferroelectric film and the single crystal substrate, and arranging the ferroelectric film that was separated from the single crystal substrate on any substrates.

According to this aspect, after forming the ferroelectric film on the single crystal substrate with the buffer layer therebetween, the ferroelectric film is separated from the single crystal substrate and arranged on any substrates. Therefore, by forming, for example, a semiconductor element on any substrates beforehand, and forming a ferroelectric element such as a ferroelectric memory from the ferroelectric film, the ferroelectric element and the semiconductor element can be integrated.

A second aspect of this invention provides a method for manufacturing a ferroelectric element. The ferroelectric element manufacturing method has the steps of forming a buffer layer, which also functions as a sacrificial layer, on a single crystal substrate, forming a ferroelectric element on the buffer layer, separating the ferroelectric element and the single crystal substrate, and arranging the ferroelectric element that was separated from the single crystal substrate on any substrates.

According to this aspect, after forming the ferroelectric element on the single crystal substrate with the buffer layer therebetween, the ferroelectric element is separated from the single crystal substrate and arranged on any substrates. Therefore, by forming a semiconductor element on any substrates beforehand, for example, the ferroelectric element and the semiconductor element can be integrated.

Preferably, the buffer layer should have at least a metal oxide with an NaCl structure and/or a YBaCuO-type chemical compound with a layered perovskite structure.

Since these materials dissolve easily in acid, the buffer layer can function well as a sacrificial layer, moreover, a ferroelectric film for a ferroelectric element can be epitaxially grown on top of the buffer layer, making it possible to obtain a high-capability ferroelectric element.

It is also preferable that the step of separating the ferroelectric element and the single crystal substrate should have pasting a supportable material for supporting the ferroelectric element over a top face of the ferroelectric element, and separating the ferroelectric element and the single crystal substrate by etching the buffer layer, after the protective material has been pasted.

Since the ferroelectric element that was separated from the single crystal substrate is pasted to the protective material, the ferroelectric element can be handled with the protective material therebetween, making the ferroelectric element easier to handle.

Incidentally, the step of arranging the ferroelectric element that was separated from the single crystal substrate on any substrates should preferably have applying adhesive over a top face of the optional substrate and a bottom face of the ferroelectric element, and joining the separated ferroelectric element to the optional substrate, and removing the supportable material that was pasted on the top face of the ferroelectric element.

This makes it easy to arranged the separated ferroelectric element on any substrates.

Furthermore, in the case where a plurality of the ferroelectric elements are formed on the single crystal substrate, the step of separating the ferroelectric elements and the single crystal substrate should preferably have a step of forming grooves, which extend as far as the buffer layer, between the ferroelectric elements, prior to the step of pasting the supportable material for supporting the ferroelectric elements over the top faces of the ferroelectric elements.

In this way, the ferroelectric elements are separated from the single crystal substrate as plural pieces by etching the buffer layer. In particular, when using wet etching, the etching solution flows along the grooves and easily enters the central section of the buffer layer, enabling the entire buffer layer to be etched more quickly.

A third aspect of this invention provides a surface acoustic wave element has a piezoelectric thin film, which has the ferroelectric film obtained by the ferroelectric film manufacturing method, or a piezoelectric element, which has the ferroelectric element obtained by the ferroelectric element manufacturing method.

According to this aspect, the piezoelectric thin film or the piezoelectric element can be arranged on any substrates, enabling elements with different functions to be integrated by fabricating a semiconductor element or the like on any substrates beforehand.

A fourth aspect of this invention provides a frequency filter has a first electrode, formed on the piezoelectric thin film of the surface acoustic wave element, or on a protective film that is provided on the piezoelectric thin film; and a second electrode, formed on the piezoelectric thin film or the protective film. The second electrode resonates at a specific frequency, or a specific band of frequencies, of surface acoustic waves, which are created in the piezoelectric thin film by an electrical signal applied to the first electrode, and converting the surface acoustic waves to an electrical signal.

According to this aspect, the piezoelectric thin film of the surface acoustic wave element can be arranged on any substrates, enabling it to be integrated with a semiconductor element and the like, which was formed on any substrates beforehand, and making it possible to obtain a miniaturized high-performance frequency filter.

A fifth aspect of this invention provides an oscillator has an electrode for applying electrical signals, formed on the piezoelectric thin film of the surface acoustic wave element, or on a protective film that is provided on the piezoelectric thin film, the electrode generating surface acoustic waves in the piezoelectric thin film by using the applied electrical signals; and an oscillating circuit equipped with an electrode for resonance and a transistor, the oscillating circuit being formed on the piezoelectric thin film or the protective film, and resonating specific frequency, or a specific band of frequency, of the surface acoustic waves that were generated by the electrode for applying electrical signals.

According to this aspect, the piezoelectric thin film of the surface acoustic wave element can be arranged on any substrates, enabling it to be integrated with a semiconductor element and the like, which was formed on any substrates beforehand, and making it possible to obtain a miniaturized high-performance oscillator.

A sixth aspect of this invention provides an electronic circuit has the oscillator, and an electrical signal supply element, which applies electrical signals to the electrode for applying electrical signals, provided in the oscillator. The electronic circuit performs the functions of selecting specific frequency components from frequency of electrical signals, or converting it to specific frequency, and modulating electrical signals in a predetermined manner, demodulating it in a predetermined manner, or detecting waves in a predetermined manner.

According to this aspect, the piezoelectric thin film has the surface acoustic wave element of the oscillator can be arranged on any substrates, enabling it to be integrated with a oscillating circuit and the like, which was formed on any substrates substrate beforehand, and making it possible to obtain a miniaturized high-performance electronic circuit.

A seventh aspect of this invention provides an electronic apparatus has at least one of the frequency filter, the oscillator, and the electronic circuit.

This electronic apparatus can be easily integrated with a semiconductor element and the like, and can be miniaturized while achieving high capability.

DETAILED DESCRIPTION OF THE INVENTION

Preferred embodiments of the ferroelectric film manufacturing method, the ferroelectric element manufacturing method, the surface acoustic wave element, the frequency filter, the oscillator, the electronic circuit, and the electronic apparatus of this invention, will be explained with reference to the diagrams.

Each of these diagrams is a schematic diagram, the members being shown in different sizes in order to make them easier to identify.

Firstly, a method for manufacturing the ferroelectric element will be explained. The ferroelectric element manufacturing method has steps of forming a buffer layer, which functions as a sacrificial layer, on a single crystal substrate (step 1), forming a ferroelectric element on the buffer layer (step 2), separating the ferroelectric element and the single crystal substrate (step 3), and arranging the ferroelectric element that was separated from the single crystal substrate on any substrates (step 4). Each step of this embodiment will be explained, taking as an example a method for manufacturing a ferroelectric element to be applied in a ferroelectric memory.

(Step 1)

Figure 1A:
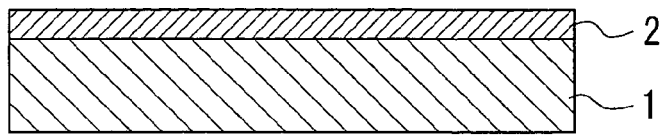
FIGS. 1A to 1D are diagrams showing steps of manufacturing a ferroelectric element of this invention.

As shown in FIG. 1A, a buffer layer 2 of SrO is formed on a single crystal substrate 1 of Si (100). There are no particular restrictions on the method for forming the film, which may, for example, be formed by any conventional method such as sputtering, deposition, or MBE; this embodiment uses laser abrasion, a type of deposition.

An SrO ceramic is used as the target, the film-formation temperature (substrate temperature) is 650° C., and oxygen partial pressure during film-formation is no greater than $1.33 \times 10^{-3}$ Pa ($1 \times 10^{-5}$ Torr). The conditions for forming the film are not, of course, restricted to these.

Under these conditions, an SrO thin film is epitaxially grown with (110) or (100) orientation which is normal to the single crystal substrate 1 surface, obtaining a superior crystal film.

Instead of SrO, various types of material can be used for the buffer layer 2. Specifically, it is acceptable to use a metal oxide with an NaCl structure (e.g. MgO, CaO, BaO), or a YBaCuO-type compound with a layered perovskite structure. These materials and SrO function well as sacrificial layers, since they dissolve easily in acid or the like, and ferroelectric film can be grown epitaxially on them. In order words, these materials function as a buffer layer for epitaxially growing a lower electrode 3 and a ferroelectric thin film 4 on the buffer layer 2, as explained below.

Instead of fabricating the buffer layer 2 from a single material, it may be formed from a plurality of different stacked materials, so that it functions not only as a sacrificial layer but also as a buffer layer, on which film can be epitaxially grown. Specifically, the buffer layer 2 may have a stacked structure formed by epitaxially growing YSZ, $CeO_2$, and $YBa_2Cu_3Oy$, in that order on the single crystal substrate 1. When the buffer layer 2 is stacked in this way, although YSZ and $CeO_2$ are stable in acid, $YBa_2Cu_3Oy$ dissolves easily in acid or water, allowing the buffer layer 2 to function as a sacrificial layer in a subsequent step.

(Step 2)

Figure 1B:
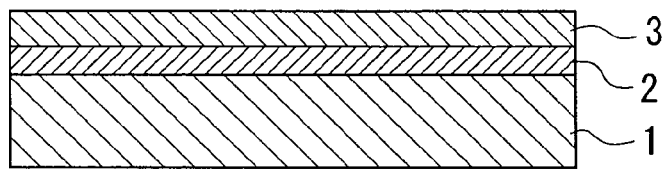

Next, as shown in FIG. 1B, a bottom electrode 3 comprising an $SrRuO_3$ thin film is formed on the buffer layer 2. There are no particular restrictions on the method for forming this thin film, which may, for example, be formed by any conventional method such as sputtering, deposition, or MBE; this embodiment uses laser abrasion.

At a film-formation temperature (substrate temperature) of no less than 600° C., and oxygen partial pressure of $1.33 \times$Pa ($1 \times 10^{-2}$ Torr) during film-formation, the $SrRuO_3$ thin film is epitaxially grown on the buffer layer 2 with an orientation of (100) pseudcubic.

The conditions for forming the film are not, of course, restricted to these.

The bottom electrode 3 is not restricted to $SrRuO_3$, and a variety of materials may be used instead. Specifically, it is possible to use compounds such as $CaRuO_3$, $BaRuO_3$, $La1\text{-}xSrxVO_3$, $La1\text{-}xSrxMnO_3$, and $La1\text{-}xSrxCoO_3$, or metals such as Pt, Ir, and Ru.

Figure 1C:
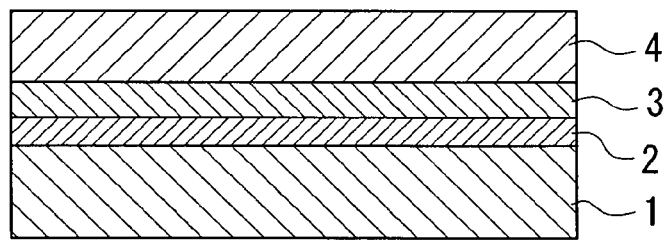

Next, as shown in FIG. 1C, a ferroelectric thin film 4 of lead zirconate titanate (hereinafter PZT) has a tetragonal composition, and is formed on the bottom electrode 3. There are no particular restrictions on the method for forming the ferroelectric thin film 4, which may be formed by any conventional method (e.g. liquid drop discharge such as ink jet method); this embodiment uses sol-gel method. There are no restrictions on the conditions for using sol-gel method, and these conditions may be set as appropriate. Using sol-gel method under given conditions, a PZT thin film is epitaxially grown with an (100) orientation on the $SrRuO_3$ thin film (bottom electrode 3), which was also grown epitaxially.

The ferroelectric thin film 4 is not restricted to PZT, and a variety of materials may be used instead. Specific examples are lead titanium zirconium lanthanum (Pb, La) $ZrO_3$: PLZT), lead magnesium niobate titanate (Pb (Mg, Nb) $TiO_3$: PMN-PT), lead magnesium niobate zirconate titanate (Pb (Mg, Nb) (Zr, Ti) $O_3$: PMN-PZT), lead zinc niobate titanate (Pb (Zn, Nb) $TiO_3$: PZN-PT), lead scandium niobate titanate (Pb (Sc, Nb) $TiO_3$: PSN-PT), lead nickel niobate titanate (Pb (Ni, Nb) $TiO_3$: PNN-PT), (Ba1-xSrx) $TiO_3$ ($0 \leq x \leq 0.3$), $Bi_4Ti_3O_{12}$, $SrBi_2Ta_2O_9$, $LiNbO_3$, $LiTaO_3$, $KNbO_3$, $BiFeO_3$, and such like.

Figure 1D:
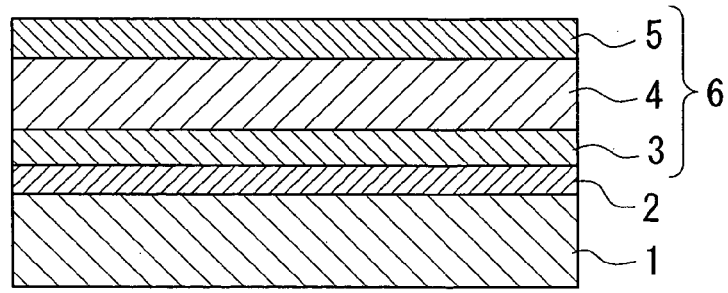

Next, as shown in FIG. 1D, an top electrode 5 of Pt (platinum) is deposited or sputtered on the ferroelectric thin film 4, thereby obtaining a ferroelectric element 6, which is included of the bottom electrode 3, the ferroelectric thin film 4, and the top electrode 5.

As for the characteristics of the ferroelectric element 6 obtained in this way, its Pr (residual polarization) was found to be 80 μC/cm$^2$, and its hysteresis rectangular characteristic was extremely good. Furthermore, in fatigue testing, its characteristics did not deteriorate until it was used $10^{12}$ times.

The material used in forming the top electrode 5 is not restricted to Pt, and any conductive material can be used. To protect the ferroelectric element 6 during an etching process described later, a protective film of resist, $SiO_2$, or the like, should preferably be covered over the top electrode 5

It is also possible to use, for example, a single-crystal substrate of a ceramic such as $SrTiO_3$.

(Step 3)

Figure 2A:
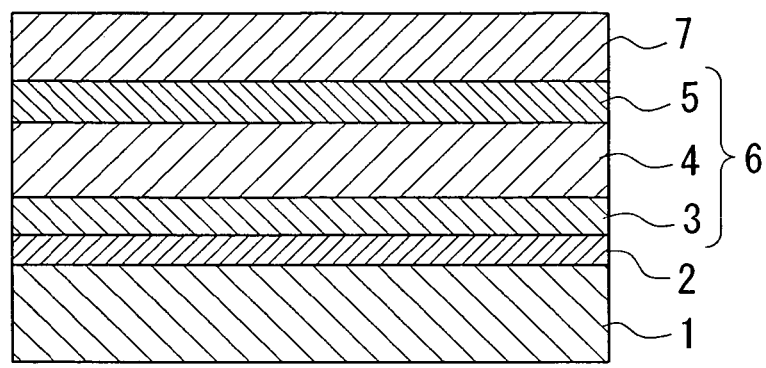
FIGS. 2A and 2B are diagrams showing steps of manufacturing the ferroelectric element of this invention.

Subsequently, as shown in FIG. 2A, a supportable material 7 for supporting the ferroelectric element 6 is pasted over the surface of the ferroelectric element 6, that is, the side of the top electrode 5. A sticky film, or a substrate with an adhesive layer, or the like, may be used as the supportable material 7. The sticky film should ideally be flexible and transparent, and have a UV-setting or thermosetting sticking agent on one side. The substrate with an adhesive layer should ideally include a low-cost and form-preserving glass substrate or the like, which an adhesive has been pasted onto. The adhesive should preferably be one that can easily be peeled off, by thermal melting or the like, in a subsequent process.

A form-preserving substrate should be used as the supportable material 7, particularly when a great number of ferroelectric elements 6 have been formed on the single crystal substrate 1, in order to transfer the ferroelectric elements 6 all together. When joining the ferroelectric elements 6 during a subsequent process, a transparent film should preferably be used to facilitate positioning alignment.

In this embodiment, a sticky film is used as the protective material 7.

Figure 2B:
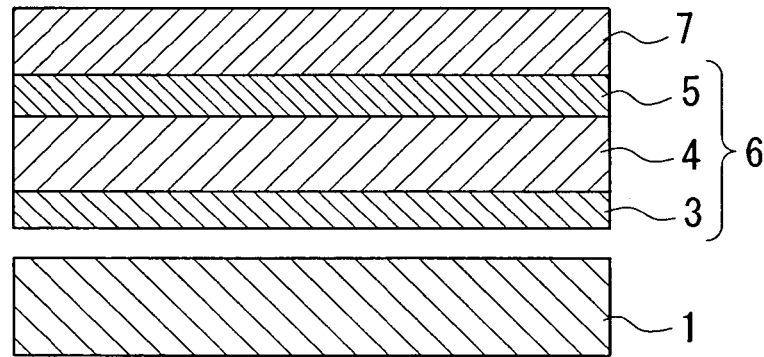

Next, the buffer layer 2 is etched away and dissolved, separating the ferroelectric element 6 from the single crystal substrate 1 as shown in FIG. 2B. A diluted nitric acid is, for instance, used as the etching solution, but there are no restrictions on this, and other acids and the like may be used instead. When the buffer layer 2 is formed from SrO, or MgO, BaO, CaO, and $YBa_2Cu_3Oy$, it can easily be removed from the single crystal substrate 1, since these substances have extremely high etching speeds when using acid as described above. Therefore, an etching solution of acid should preferably have low density in order to protect the ferroelectric element 6. As mentioned earlier, the characteristics of the ferroelectric element 6 can be reliably prevented from deteriorating due to the etching solution by covering the ferroelectric element 6 with a protective film which is resistant to the etching solution.

The single crystal substrate 1 can be reused to form another ferroelectric element after it has been separated from the ferroelectric element 6.

(Step 4)

Figure 3A:
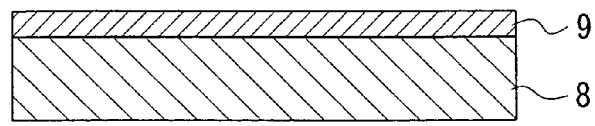
FIGS. 3A to 3D are diagrams showing steps of manufacturing the ferroelectric element of this invention.

Next, as shown in FIG. 3A, any substrates 8 are prepared, and an adhesive is pasted on top of it to form an adhesive layer 9. The purpose of any substrates 8 is to mount the ferroelectric element 6, and this embodiment uses a silicon substrate, which a semiconductor element has been formed on beforehand. That is, the semiconductor element is formed on the surface layer section of the silicon substrate, and an amorphous $SiO_2$ layer is formed on the semiconductor element. Since it is usually difficult to epitaxially grow ferroelectric thin film on a silicon substrate (any substrates 8) of this type, the ferroelectric element cannot be formed directly on the silicon substrate.

Thermosetting adhesive, photosetting adhesive such as UV-setting adhesive, reaction-setting adhesive, and such like, can be used as the adhesive layer 9, but it is preferable to use an adhesive having properties that are different to those of the sticking agent of the sticky film, which was used as the supportable material 7. This is because the adhesive layer 9 must remain when the supportable material 7 is peeled away from the ferroelectric element 6 as explained later. The adhesive layer 9 can, for example, be painted on. Instead of forming the adhesive layer 9 on any substrates 8, it can be formed on the bottom surface of the ferroelectric element 6 (i.e. the bottom electrode side).

Figure 3B:
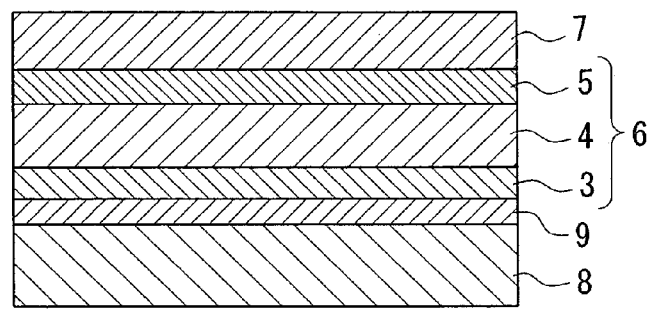

As shown in FIG. 3B, after forming the adhesive layer 9 in this manner, the ferroelectric element 6 is aligned in a predetermined position on any substrates 8, and is joined to any substrates 8 by pressure.

Figure 3C:
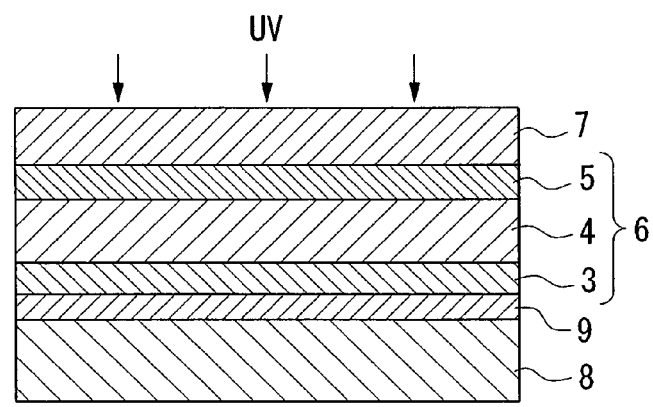

Subsequently, the supportable material 7, which was pasted to the surface of the ferroelectric element 6, is removed from the ferroelectric element 6. As shown in FIG. 3C, when a UV-setting adhesive was used as the sticking agent for the film of the supportable material 7, ultraviolet light is radiated from the film (supportable material 7) side, eliminating the sticking force of the sticking agent of the film.

Figure 3D:
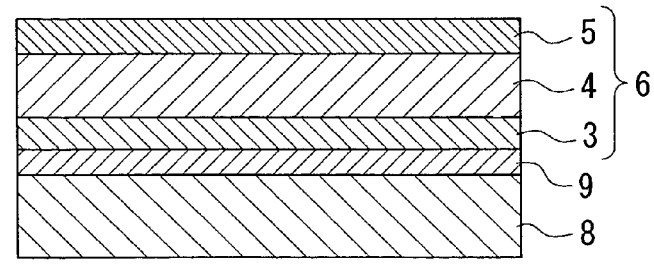

Once its sticking force has been eliminated, the film (supportable material 7) is peeled away, thereby removing the supportable material 7 from the ferroelectric element 6 as shown in FIG. 3D.

Thereafter, the ferroelectric element 6 is electrically connected to the semiconductor element that was formed beforehand on any substrates 8, obtaining the intended ferroelectric memory. An investigation of the characteristics of the ferroelectric element 6 after it was transferred onto any substrates 8 is this manner found almost no change from its characteristics when it was formed on the single crystal substrate 1.

In this ferroelectric element manufacturing method, the ferroelectric element 6 is formed on the single crystal substrate 1 with the buffer layer 2 therebetween, and the ferroelectric element 6 is then separated from the single crystal substrate 1 and arranged on any substrates 8; therefore, by forming a semiconductor element on any substrates 8 beforehand, it becomes easy to integrate the ferroelectric element and the semiconductor element to obtain a ferroelectric memory or the like. That is, according to this manufacturing method, the ferroelectric element 6 of high-grade epitaxial film can easily be provided on amorphous silicon, such as an interlayer insulating film, or on a protective film formed on any substrates 8.

Since the buffer layer 2 includes a metal oxide with an NaCl structure or at least one type of YBaCuO-type compound with a layered perovskite structure, it is able to function well as a sacrificial layer since it will dissolve easily in acid or the like, and the ferroelectric thin film 4 can be epitaxially grown on it, making it possible to obtain a high-performance ferroelectric element 6.

Incidentally, in this embodiment, a semiconductor element is formed on the surface layer section of any substrates 8 as described above, and an amorphous $SiO_2$ layer is formed on the semiconductor element, but the present invention is not restricted to this arrangement, it being possible to use a wide variety of any substrates such as, for example, a glass substrate, a metal substrate, a plastic substrate, and a flexible substrate.

The ferroelectric thin film 4 may be fabricated by deposition or sputtering.

In the ferroelectric element manufacturing method of this invention, particularly when providing a plurality of ferroelectric elements 6 on the single crystal substrate 1, it is acceptable to provide grooves, which are deep enough to reach the buffer layer 2 between the ferroelectric elements 6, prior to coating the surfaces of the ferroelectric elements 6 with the supportable material 7.

This enables the ferroelectric elements to be separated in plural pieces by etching of the buffer layer 2. In particular, when using wet etching, the etching solution flows along the grooves and easily enters the central section of the buffer layer 2, enabling the entire buffer layer 2 to be etched more quickly.

This embodiment describes a ferroelectric element manufacturing method, but it is acceptable to form only the ferroelectric thin film 4 without forming the bottom electrode 3 and the top electrode 5. By forming only the ferroelectric thin film 4, this invention becomes a ferroelectric film manufacturing method. In many cases, the ferroelectric thin film 4 obtained by this method also functions as a piezoelectric thin film.

Figure 4:
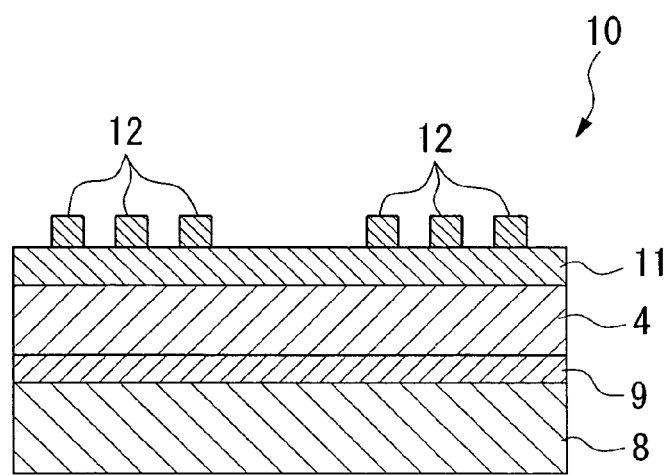
FIG. 4 is a side cross-sectional view of a surface acoustic wave element of this invention.

As an example of an element obtained by the ferroelectric film manufacturing method, FIG. 4 shows a surface acoustic wave element 10. To manufacture the surface acoustic wave element 10, in this embodiment, a piezoelectric thin film (ferroelectric thin film 4) is fabricated directly onto the buffer layer 2 without forming the bottom electrode 3, and this piezoelectric film (ferroelectric thin film 4) is arranged on any substrates 8 with the adhesive layer 9 in between, as shown in FIG. 4. Then, an electrode 12 is provided on the ferroelectric thin film 4 with a protective film 11 in between, obtaining the surface acoustic wave element 10. The electrode 12 includes an inter-digital transducer (hereinafter "IDT electrode"), and when viewed from above has a similar shape to, for example, inter-digital electrodes 41, 42, 51, and 53, illustrated below in FIGS. 5 and 6.

$LiNbO_3$, $LiTaO_3$, and $KNbO_3$, are examples of materials that are used as the piezoelectric thin film (ferroelectric thin film 4) in the surface acoustic wave element 10, but semiconductor devices dislike these materials because they contain alkali metal. Nevertheless, by using the method of this invention as described above, the ferroelectric film can be integrated easily with a semiconductor device without any problems arising from diffusion of alkali metal or the like.

In addition to manufacturing the surface acoustic wave element 10, this type of ferroelectric element manufacturing method can be applied in manufacturing other piezoelectric elements, for example. Specifically, it can be applied in the manufacture of an ink jet head using a piezoelectric thin film, and an ink jet printer using the ink jet head.

Figure 5:
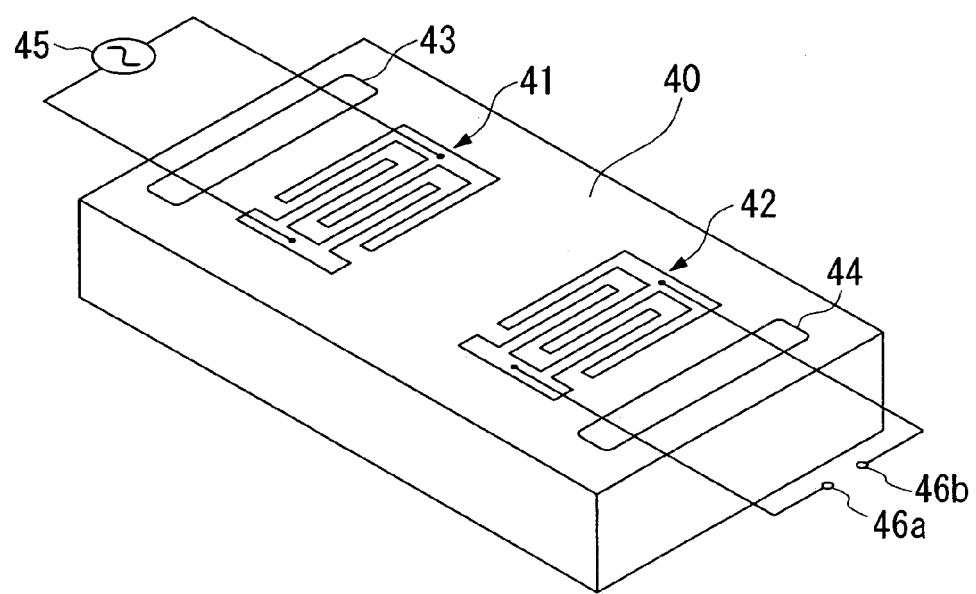
FIG. 5 is a perspective view of a frequency filter of this invention.

FIG. 5 shows an external view of a frequency filter according to an embodiment of this invention.

As shown in FIG. 5, the frequency filter has a substrate 40. Any substrates, to which the surface acoustic wave element shown in FIG. 10 has been transferred, is for example used as the substrate 40. In the case of a substrate on which the surface acoustic wave element has been formed, the adhesive layer 9, the piezoelectric thin film (ferroelectric thin film 4), and the protective film 1, are formed in that order on any substrates 8 of silicon.

IDT electrodes 41 and 42 are formed on the top surface of the substrate 40. The IDT electrodes 41 and 42 are, for example, formed from Al or Al alloy, and their thicknesses are set at roughly one-hundredth of their pitches. Sound-absorbing sections 43 and 44 are provided on the top surface of the substrate 40 on either side of the IDT electrodes 41 and 42. The sound-absorbing sections 43 and 44 absorb surface acoustic waves, which propagate along the surface of the substrate 40. A high-frequency signal source 45 connects to the IDT electrode 41, and a signal line connects to the IDT electrode 42, formed on the substrate 40.

In this constitution, when a high-frequency signal is output from the high-frequency signal source 45, the high-frequency signal is applied to the IDT electrode 41, generating surface acoustic waves on the top surface of the substrate 40. The surface acoustic wave propagates across the top surface of the substrate 40 at a speed of approximately 5000 m/s. Surface acoustic waves that have propagated from the IDT electrode 41 to the sound-absorbing section 43 side are absorbed by the sound-absorbing section 43; of the surface acoustic waves that have propagated to the IDT electrode 42 side, waves at a specific frequency, determined in accordance with the pitch and the like of the IDT electrode 42, and waves in a specific band, are converted to an electrical signal, travel along the signal wire, and are extracted at terminals 46a and 46b. Most of the frequency components other than those at the specific frequency and in the specific band pass through the IDT electrode 42 and are absorbed into the sound-absorbing section 44. In this way, when electrical signals are supplied to the IDT electrode 41 of the frequency filter of this embodiment, only surface acoustic waves at a specific frequency and in a specific band are obtained (filtered).

Figure 6:
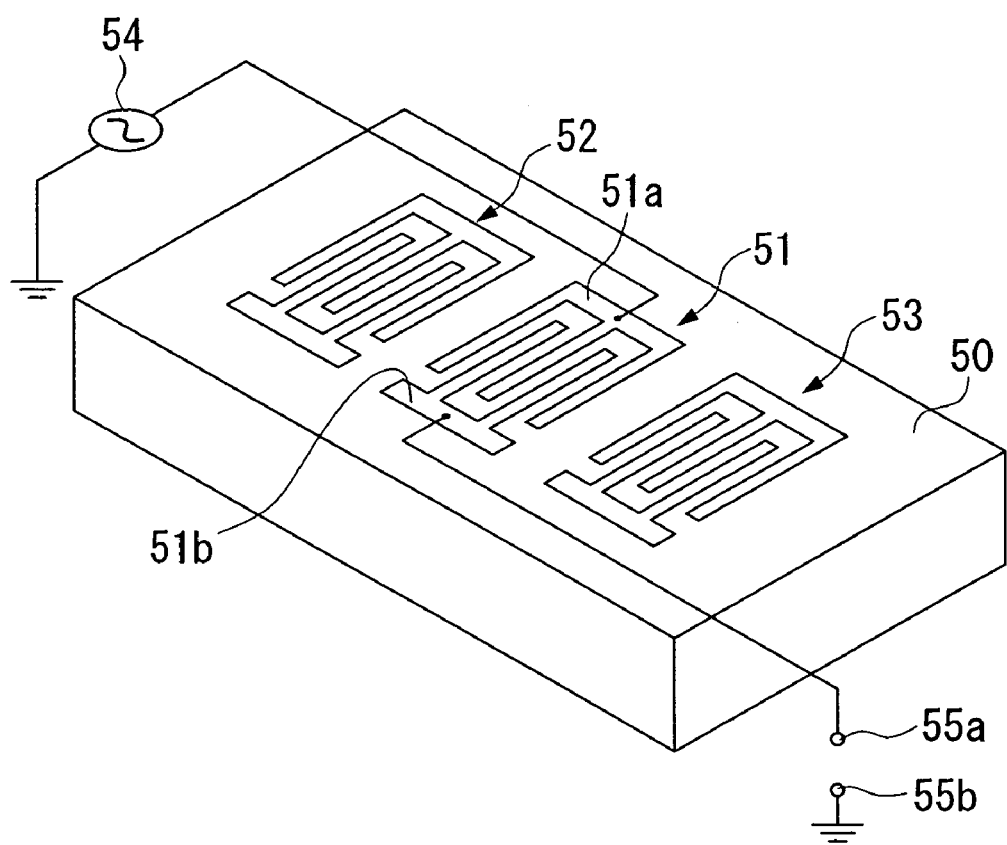
FIG. 6 is a perspective view of an oscillator of this invention.

FIG. 6 shows the external view of an oscillator according to an embodiment of this invention.

As shown in FIG. 6, the oscillator has a substrate 50. As in the case of the frequency filter, a substrate on which the surface acoustic wave shown in FIG. 4 has been formed is used as the substrate 50.

An IDT electrode 51 is formed on the top surface of the substrate 50, and IDT electrodes 52 and 53 are provided on each side of the IDT electrode 51. The IDT electrodes 51 to 53 are, for example, formed from Al or Al alloy, and their thicknesses are set at roughly one-hundredth of their respective pitches. A high-frequency signal source 54 is connected to one combteeth-shaped electrode 51a comprising the IDT electrode 51, and a signal line is connected to the other combteeth-shaped electrode 51b. The IDT electrode 51 corresponds to an electrode for applying electrical signals, while the IDT electrodes 52 and 53 correspond to electrodes for resonance which resonate specific frequency of surface acoustic waves, generated by the IDT electrode 51, or frequency in a specific band.

In this constitution, a high-frequency signal is output from the high-frequency signal source 54 and applied to one of the combteeth-shaped electrodes 51a of the IDT electrode 51, generating surface acoustic waves which propagate on the top surface of the substrate 50 toward the IDT electrode 52 side and the IDT electrode 53 side. The speed of the surface acoustic waves is approximately 5000 m/s. Of these surface acoustic waves, those with specific frequency components are reflected by the IDT electrodes 52 and 53; this generates a standing wave between the IDT electrodes 52 and 53. The surface acoustic waves with specific frequency are repeatedly reflected by the IDT electrodes 52 and 53, whereby specific frequency, or frequency in a specific band, resonate, increasing the amplitude. Some of the surface acoustic waves with specific frequency components or frequency components in a specific band are extracted from the other combteeth-shaped electrode 51b of the IDT electrode 51, and an electrical signal at a frequency corresponding to the resonance frequency of the IDT electrodes 52 and 53 (or at a frequency having a degree of band) can be extracted at terminals 55a and 55b.

Figure 7A:
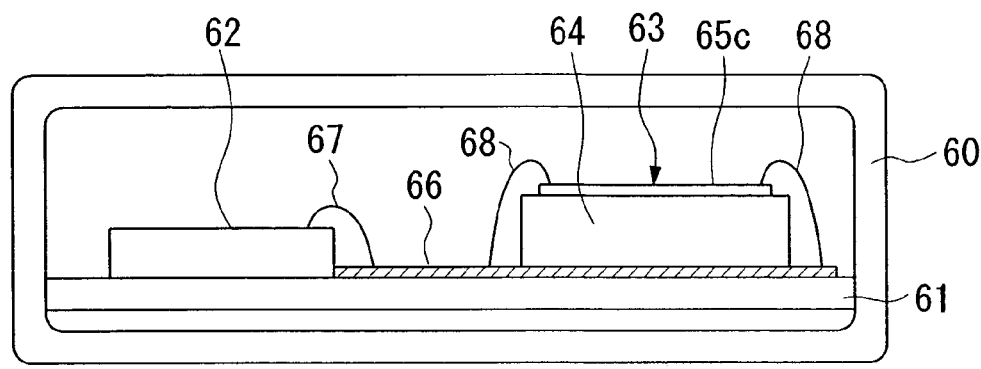
FIGS. 7A and 7B are schematic diagrams showing an example where the oscillator of FIG. 6 is applied in a VCSO.
Figure 7B:
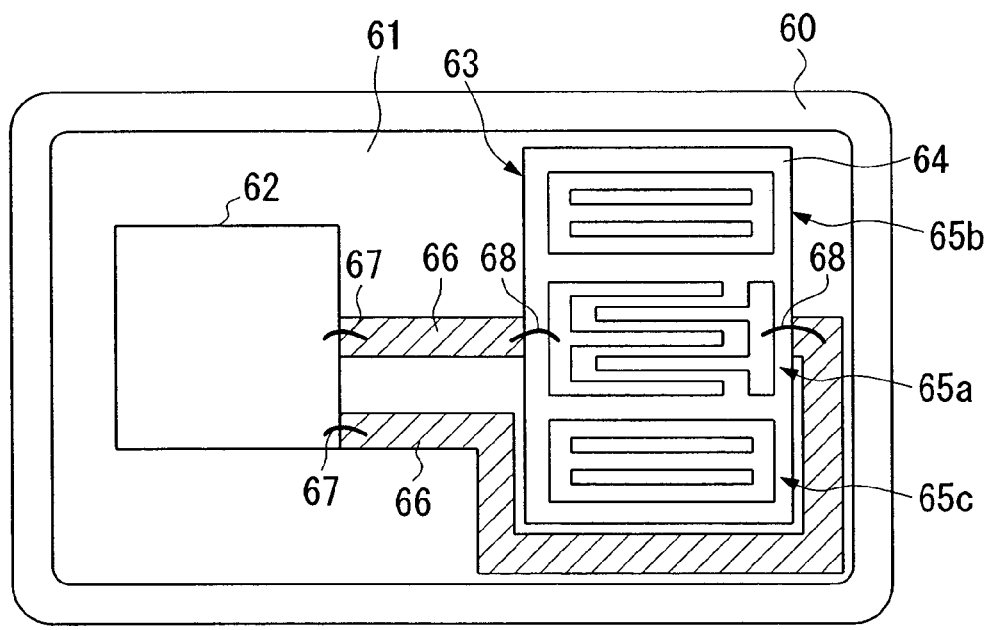

FIGS. 7A and 7B show an example where the oscillator (surface acoustic wave element) of this invention is applied in a VCSO (voltage controlled SAW oscillator), FIG. 7A showing a side perspective projection, and FIG. 7B, a top perspective projection.

The VCSO is installed inside a metal (Al or stainless steel) or ceramic case 60. An IC (integrated circuit) 62 and an oscillator 63 are mounted on a substrate 61. The IC 62 is an oscillating circuit, which controls a frequency applied to the oscillator 63 in accordance with a voltage input from an unillustrated external circuit.

The oscillator 63 includes IDT electrodes 65a to 65c, arranged on a substrate 64, and has roughly the same constitution as the oscillator shown in FIG. 6. As in the fourth embodiment described above, for example, a substrate on which the surface acoustic wave shown in FIG. 4 has been formed is used as the substrate 64.

Interconnections 66 for connecting the IC 62 and the oscillator 63 are patterned on the substrate 61. The IC 62 and the interconnections 66 are connected by a wire 67 comprising, for example, metal or the like, and, by connecting the oscillator 63 to the interconnections 66 by using a wire 68, the IC 62 and the oscillator 63 are electrically connected via the interconnections 66.

The VCSO can also be used by integrating the IC 62 and the oscillator (surface acoustic wave element) 63 on the same substrate.

Figure 8:
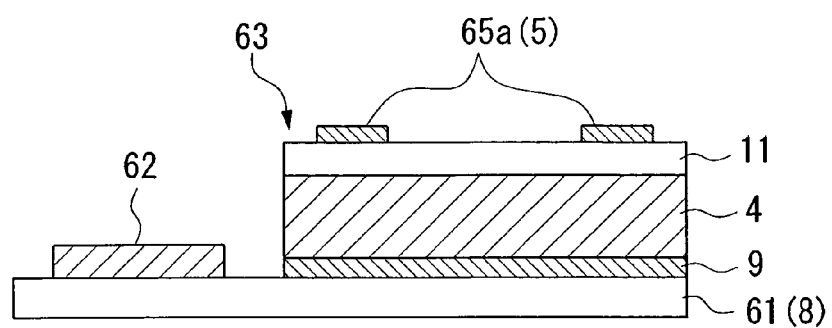
FIG. 8 is a schematic diagram showing an example where the oscillator of FIG. 6 is applied in a VCSO.

FIG. 8 shows a schematic diagram of the VCSO in which the IC 62 and the oscillator 63 have been integrated. In FIG. 8, the oscillator 63 has the structure of the surface acoustic wave element 10 shown in FIG. 4.

As shown in FIG. 8, in this VCSO, the IC 62 and the oscillator 63 share a single crystal silicon substrate 61 (8). The IC 62 and an electrode 65a attached to the oscillator 63 are electrically connected, although this connection is not shown in FIG. 8. In this embodiment, a TFT (thin film transistor) is used to constitute the IC 62.

By using a TFT to constitute the IC 62, in this embodiment, the TFT is formed on the single-crystal silicon substrate 61, and the oscillator (surface acoustic wave element) 63 is formed on another substrate; thereafter, the oscillator 63 can be transferred onto the single-crystal silicon substrate 61 and integrated with the TFT. Therefore, even when it is difficult to form the oscillator (surface acoustic wave element) 63 directly on the substrate, or when the oscillator 63 is composed of material that cannot be formed in this way, the method of this invention enables it to be formed easily by transfer.

The VCSO shown in FIGS. 7A, 7B, and 8, is for example used as a voltage controller oscillator in a PLL circuit. A brief explanation of this PLL circuit will be given.

Figure 9:
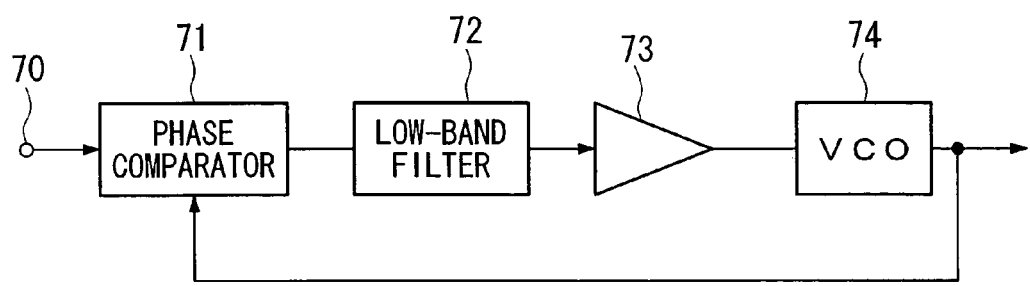
FIG. 9 is a block diagram showing the basic constitution of a PLL circuit.

FIG. 9 is a block diagram showing the basic constitution of a PLL circuit, which here includes a phase comparator 71, a low-band filter 72, an amplifier 73, and a VCSO 74. The phase comparator 71 compares the phase (or frequency) of a signal that was input from an input terminal 70, with the phase (or frequency) of a signal that was output from the VCSO 74, and outputs an error voltage signal, the value of which has been set in accordance with the difference between the phases (or frequencies). The low-band filter 72 passes only low-band components at the position of the error voltage signal that was output from the phase comparator 71, and the amplifier 73 amplifies the signal that was output from the low-band filter 72. The VCSO 74 is an oscillating circuit, the oscillating frequency of which changes continuously in accordance with the input voltage value.

Based on such a constitution, the PLL circuit reduces the difference between the phase (or frequency) of the signal that is input from the input terminal 70 and the phase (or frequency) of the signal that is output from the VCSO 74, thereby synchronizing the frequencies of the two signals. When the frequency of the signal output from the VCSO 74 is synchronized with the frequency of the signal input from the input terminal 70, the VCSO 74 thereafter outputs a signal that matches the signal input from the input terminal 70, excepting when there is a constant phase difference, and keeps track with changes in the input signal.

Figure 10:
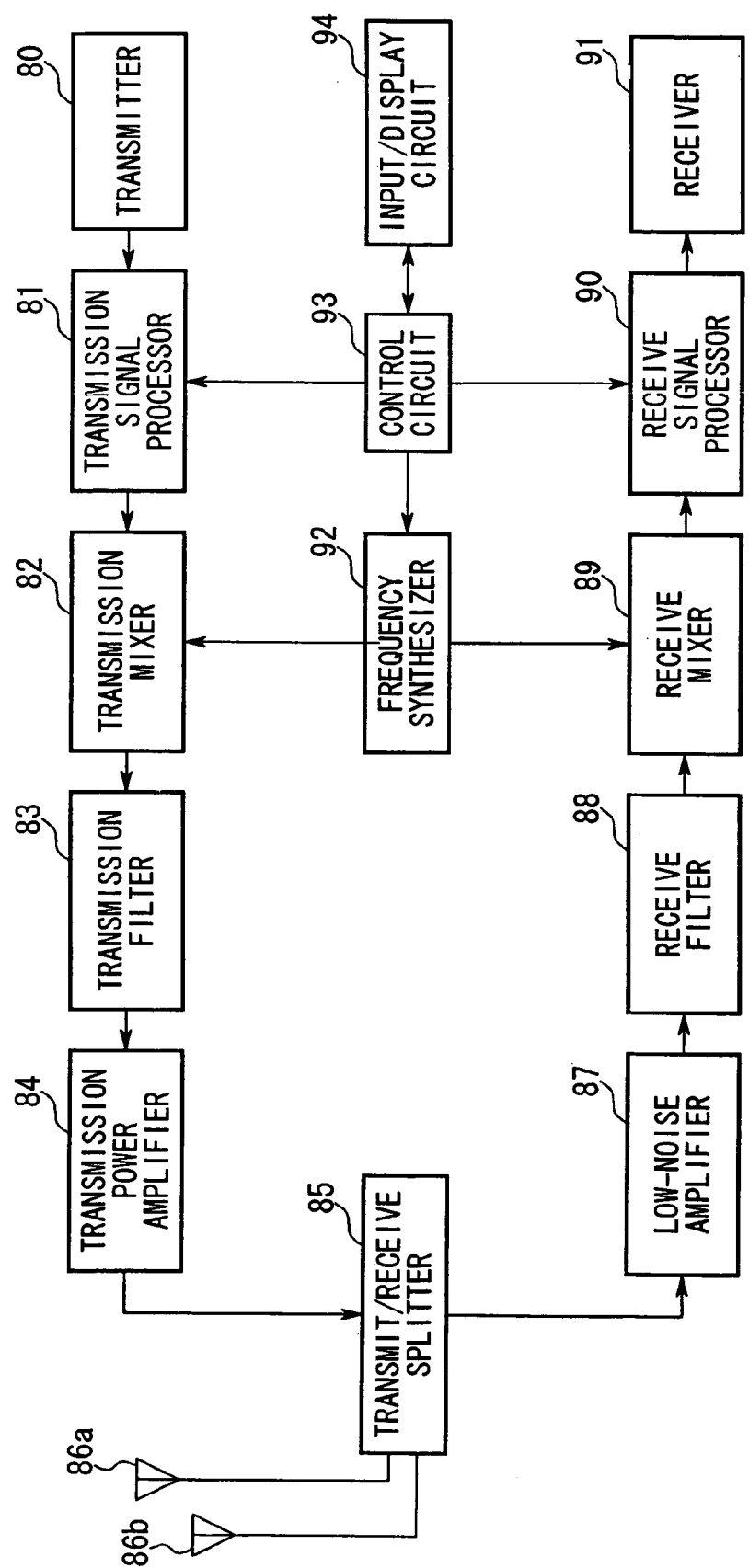
FIG. 10 is a block diagram showing the constitution of an electronic circuit of this invention.

FIG. 10 is a block diagram showing the electrical constitution of an electronic circuit according to an embodiment of this invention. The electronic circuit shown in FIG. 10 is provided, for example, in a mobile telephone device 100 shown in FIG. 11. The mobile telephone device 100 shown in FIG. 11 is one example of the electronic apparatus of this invention, and has an antenna 101, a receiver 102, a transmitter 103, a liquid crystal display section 104, a control panel 105, etc.

The electronic apparatus shown in FIG. 10 has the basic constitution of an electronic apparatus that is provided inside the mobile telephone device 100, and includes a transmitter 80, a transmission signal processor 81, a transmission mixer 82, a transmission filter 83, a transmission power amplifier 84, a transmit/receive splitter 85, antennas 86a and 86b, a low-noise amplifier 87, a receive filter 88, a receive mixer 89, a receive signal processor 90, a receiver 91, a frequency synthesizer 92, a control circuit 93, and an input/display circuit 94. In fact, since mobile telephone devices in present use perform multiple frequency conversion processes, their circuit constitutions are more complex than that shown here.

Figure 11:
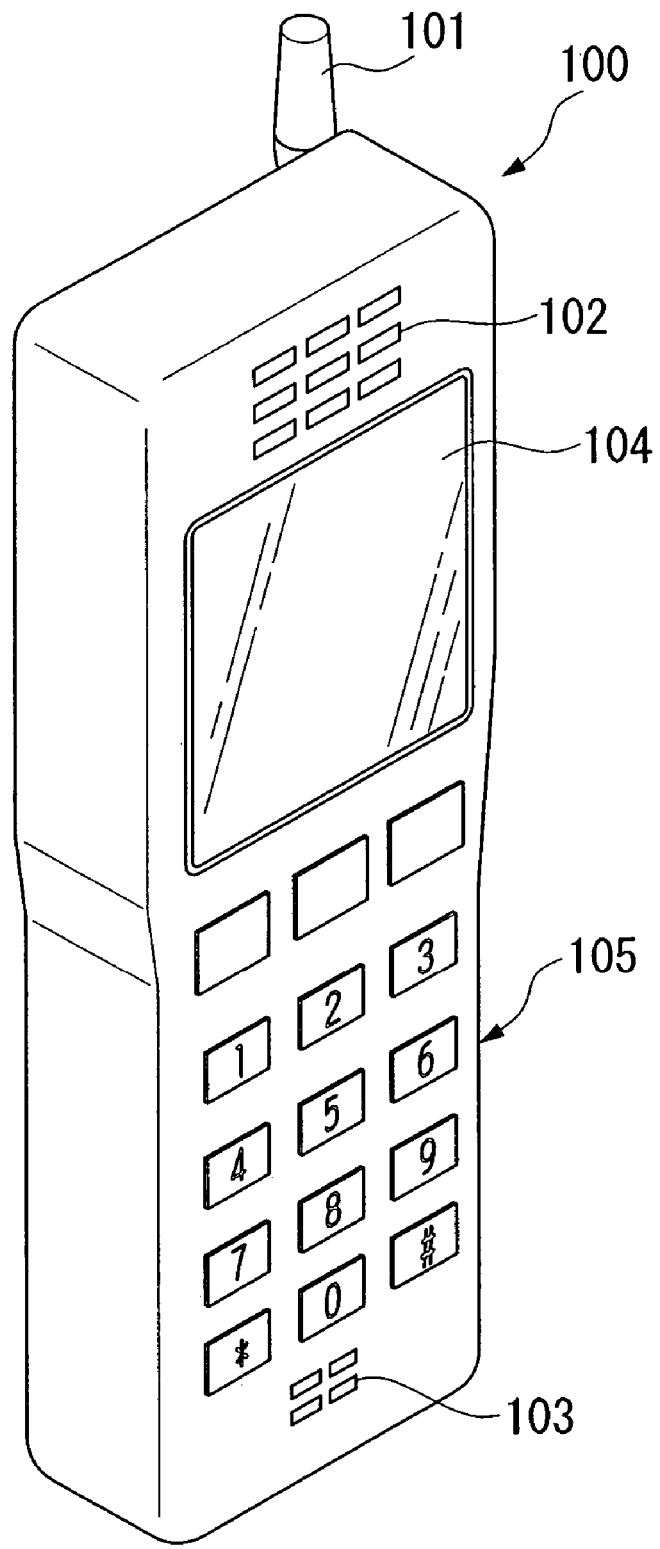
FIG. 11 is a perspective view of a mobile telephone as an embodiment of an electronic apparatus.

The transmitter 80 is realized by, for example, a microphone for converting an audio wave signal to an electrical signal, and corresponds to the transmitter 103 in the mobile telephone device 100 of FIG. 11. The transmission signal processor 81 processes the electrical signal output from the transmitter 80, such as D/A conversion, modulation, and such processes. The transmission mixer 82 mixes the signal output from the transmission signal processor 81 by using a signal output from the frequency synthesizer 92. The frequency of the signal supplied to the transmission mixer 82 is, for example, approximately 380 MHz. The transmission filter 83 only passes signals at a frequency needed as an intermediate frequency (hereinafter termed "IF"), and cuts off signals at unnecessary frequencies. The signal that is output from the transmission filter 83 is converted to an RF signal by an unillustrated converter. The frequency of this RF signal is, for example, approximately 1.9 GHz. The transmission power amplifier 84 amplifies the RF signal, output from the transmission filter 83, and sends it to the transmit/receive splitter 85.

The transmit/receive splitter 85 outputs the RF signal from the transmission power amplifier 84 to the antennas 86a and 86b, and transmits from the antennas 86a and 86b in an electromagnetic waveform. The transmit/receive splitter 85 splits a receive signal, received by the antennas 86a and 86b, and outputs it to the low-noise amplifier 87. The frequency of the receive signal, output from the transmit/receive splitter 85, is, for example, approximately 2.1 GHz. The low-noise amplifier 87 amplifies the receive signal from the transmit/receive splitter 85. The signal output from the low-noise amplifier 87 is converted to the IF by an unillustrated converter.

The receive filter 88 only passes signals at frequencies required by the IF, converted by the unillustrated converter, and cuts off signals at unnecessary frequencies. The receive mixer 89 mixes the signal that is output from the transmission signal processor 81 by using a signal from the frequency synthesizer 92. The intermediate frequency supplied to the receive mixer 89 is, for example, approximately 190 MHz. The receive signal processor 90 processes the signal output from the receive mixer 89, such as A/D conversion, demodulation, and such processes. The receiver 91 is realized by a miniature speaker, which converts electrical signals to audio sound, and corresponds to the receiver 102 in the mobile telephone device 100 shown in FIG. 11.

The frequency synthesizer 92 creates the signals supplied to the transmission mixer 82 (e.g. at a frequency of approximately 380 MHz) and the signals supplied to the receive mixer 89 (e.g. at a frequency of 190 MHz). The frequency synthesizer 92 is equipped with a PLL circuit which resonates at a resonance frequency of, for example, 760 MHz; the signal output from this PLL circuit is divided to create a signal at a frequency of 380 MHz, and then divided again to create a signal at a frequency of 190 MHz. The control circuit 93 controls the overall operation of the mobile telephone device by controlling the transmission signal processor 81, the receive signal processor 90, the frequency synthesizer 92, and the input/display circuit 94. The input/display circuit 94 displays the status of the device to a user of the mobile telephone device 100 shown in FIG. 11, and inputs commands from an operator; the input/display circuit 94 corresponds, for example, to the liquid crystal display section 104 and the control panel 105 of the mobile telephone device 100.

In the constitution of the electronic circuit described above, the frequency filter shown in FIG. 5 is used as the transmission filter 83 and the receive filter 88. The filtering frequency (pass frequency) is set separately for the transmission filter 83 and the receive filter 88 in accordance with the necessary frequency among the signals output from the transmission mixer 82, and with the frequency needed by the receive mixer 89. The PLL circuit provided in the frequency synthesizer 92 uses the oscillator shown in FIG. 6, or the oscillator (VCSO) shown in FIGS. 7 and 8, as the VCSO 74 of the PLL circuit shown in FIG. 8.

This concludes the explanation of the surface acoustic wave element, frequency filter, oscillator and manufacturing method thereof, electronic circuit, and electronic apparatus (mobile telephone device 100) according to this invention, but this invention is not restricted to the above embodiments, and can be freely modified in without deviating from its scope.

For example, the preceding embodiment describes a mobile telephone device as the electronic apparatus, but it is possible to use other types of portable data devices, personal computers, and the like. An example was given of an electronic circuit installed in a mobile telephone device, but this invention can also be applied to electronic apparatuses in various other types of mobile communication devices.

This invention can be applied not only in mobile communication devices but also in communication devices, and electronic circuits inside the communication devices, which are used in the fixtures of tuners and the like for receiving BS and CS broadcasts. Further, this invention can be applied not only in communication devices which act as communication carriers by propagating wave through the air, but also in electronic apparatuses such as HUB, which use high-frequency signal propagating along coaxial cables, or optical signals propagating along optical cables, and in electronic circuits contained in such devices.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A ferroelectric element manufacturing method comprising:

forming a buffer layer, which also functions as a sacrificial layer, on a single crystal substrate;

forming a ferroelectric element on the buffer layer;

separating the ferroelectric element and the single crystal substrate; and arranging the ferroelectric element that was separated from the single crystal substrate on any substrates, wherein the separating of the ferroelectric element and the single crystal substrate includes:

pasting a supportable material for supporting the ferroelectric element over a top face of the ferroelectric element; and separating the ferroelectric element from the single crystal substrate by etching the buffer layer, after the supportable material has been pasted, and the arranging of the ferroelectric element that was separated from the single crystal substrate on any substrates includes:

applying adhesive over a top face of any substrates and a bottom face of the ferroelectric element, and joining the separated ferroelectric element to any substrates; and removing the supportable material that was pasted on the top face of the ferroelectric element.

* * * * *